(12) United States Patent
Andricacos et al.

(10) Patent No.: US 6,188,120 B1
(45) Date of Patent: *Feb. 13, 2001

(54) METHOD AND MATERIALS FOR THROUGH-MASK ELECTROPLATING AND SELECTIVE BASE REMOVAL

(75) Inventors: Panayotis Constantinou Andricacos, Croton-on-Hudson; Cyril Cabral, Jr., Ossining; Roy Carruthers, Stormville; Alfred Grill, White Plains; Katherine Lynn Saenger, Ossining, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/805,403

(22) Filed: Feb. 24, 1997

(51) Int. Cl.[7] .................................................. H01L 27/108
(52) U.S. Cl. ............................................. 257/532; 257/306
(58) Field of Search ...................................... 257/532, 306

(56) References Cited

U.S. PATENT DOCUMENTS

| | | |
|---|---|---|
| 5,348,894 | 9/1994 | Gnade et al. . |
| 5,432,732 * | 7/1995 | Ohmi ................................. 257/296 |
| 5,612,560 * | 3/1997 | Chivukula et al. ................... 257/310 |
| 5,807,774 * | 9/1998 | Desu et al. ........................... 438/240 |

* cited by examiner

Primary Examiner—David Hardy
(74) Attorney, Agent, or Firm—Robert M. Trepp; Anne Vachon Dougherty

(57) ABSTRACT

Multilayer metal materials are selected so that the materials will alloy or intermix under rapid thermal annealing conditions. The individual materials of the multilayers are preferably chosen such that at least one of the materials may be selectively etched with respect to the other material by wet chemical or electrochemical etching. For electroplating applications, the alloyed plating base material will assume some of the etch resistance of the original electrodeposit material such that a selective wet etch of the plating base can be performed without substantial undercutting. Furthermore, the graded composition alloy will exhibit other advantageous physical and chemical properties for electrode formation and use. The alloying or intermixing may be accomplished before or after patterning of the materials, for the instance wherein the materials deposited as blanket layers. Similarly, the alloying or intermixing may be accomplished before or after plating base removal for structures deposited by through-mask plating.

17 Claims, 4 Drawing Sheets

PRIOR ART

PRIOR ART

# METHOD AND MATERIALS FOR THROUGH-MASK ELECTROPLATING AND SELECTIVE BASE REMOVAL

FIELD OF THE INVENTION

This invention relates to multilayer metal deposition and patterning processes and more particularly to a post-deposition method for selectively removing a conductive plating base from the regions between patterned electrodeposits, which electrodeposits have been selectively alloyed.

BACKGROUND OF THE INVENTION

In the field of processing semiconductor memory devices, through-mask electroplating is a method for forming the noble metal electrodes expected to be required for devices incorporating high permittivity dielectric or ferroelectric materials. Such electrode plating is done selectively with the plated deposits being grown in defined areas of a conductive plating base layer on a substrate, which areas have been defined by lithography. While, for consistency of description, both the background of the invention and the description of the invention will be detailed with specific reference to through-mask electroplating of electrodes for semiconductor memory devices, it is not intended that the applicability of the invention be limited solely to those processes. It will be apparent to one having skill in the art that the current invention has applicability for multilayer metal deposition for other applications as well.

Through-mask plating of noble metals (and for non-noble metals as applicable), is illustrated in FIGS. 1(a) through 1(e). Reference is made to Assignee's application entitled "Plating of Noble Metal Electrodes for DRAM and FRAM", of Andricacos, et al, which issued as U.S. Pat. No. 5,789,320 on Aug. 4, 1998, the teachings of which are herein incorporated by reference. Through-mask plating is generally conducted in accordance with a process flow that begins with the deposition of a blanket layer of a conductive plating base, 1 of FIG. 1(a), deposited over the substrate, 2, on which the electrode deposits are to be grown. The plating base layer is typically thin, of the order of 20–100 nm. One or more layers may be deposited on substrate 2 prior to deposition of the plating base, to improve adhesion or to act as barriers to interlayer reactions. After the blanket layer of the plating base has been deposited, a layer of mask material, 3, is deposited on the plating base layer, followed by patterning of the mask material to expose areas of the plating base layer where plating is desired. As shown in FIG. 1(b), the mask material remains over the regions of the surface which are not to be plated. The thickness of the mask material should be greater than or equal to the thickness of the desired electrodeposit. The mask material, such as organic photoresists or diamond-like carbon (DLC), should be insulating and compatible with the plating solution. Next, the entire patterned surface is exposed to a plating step, whereby the chosen electrode plating material, 4, is selectively grown on the exposed conductive regions of the sample, as shown in FIG. 1(c). After electroplating, the mask material is removed from the areas of the plating base layer which have not been plated, leaving the structure illustrated in FIG. 1(d); and, finally the plating base is removed from those areas having no electrodeposited material, yielding the structure of FIG. 1(e).

Plating base removal is typically done by etching. The etchant and etch method may be selective or non-selective with respect to the electrode plating material, with selective etches clearly being preferred, so as to preserve the plated electrode during the plating base removal process. A complication frequently encountered is that the materials chosen for the plating base and the plated electrode are so similar that they respond similarly to a given etchant or etch process.

Furthermore, the etching process may be anisotropic (e.g., including so-called dry etching processes such as reactive ion etching) or isotropic (e.g., including so-called "wet" etching such as a bath of chemical solution). Wet etches are generally not preferred for plating base removal when fine features are present, since the wet isotropic etches do give rise to the aforementioned risk of removal of some or all of the plating base under the electrode. What is typically encountered with isotropic etching for plating base removal is partial removal of the plating base at the edges of the plated electrode feature, an effect known as "undercutting," as illustrated in the structure of FIG. 2(a). The amount of undercutting is dependent upon the duration of the etch process, with the minimum amount of undercut generally about equal to the thickness of the plating base which is being removed. If the lateral dimensions of the plated feature are large compared to the plating base thickness, an undercut of that thickness on each side of the feature may be tolerable. However, wet etching may be problematic for the submicron dimension electrode structures of interest for memory device applications, even with plating base thicknesses of 30–50 nm, since plating base undercutting may expose underlying contacts or degrade electrode-to-substrate adhesion.

As a result of the foregoing concerns, anisotropic (typically dry) etch processes are preferred for plating base removal from a device structure having fine-featured electrodeposits. If the dry etch is selective, it will only remove the plating base which had been covered by the mask material. If the dry etch is non-selective, it will remove the plating base and a small amount of the electrodeposit (i.e., the electrode plating material) at the top surface of the plated structure. Since the thickness of the electrodeposit is much greater than the thickness of the plating base layer, the sacrifice of a small amount of the electrodeposit from the top surface is acceptable. A disadvantage of using a physical dry etch process, such as rf-sputtering or ion beam sputtering, is that the surfaces of the plated electrode structures may become contaminated with residue from the etching process, including redeposits of sputtered material comprised of the plating base material and the underlying surface material, as shown in the structure of FIG. 2(b). This results in degradation of the electrical properties of the electrode structure and of a subsequently-deposited cell dielectric.

What is desired, therefore, is a selective etching process which is not subject to any of the foregoing disadvantages.

It is therefore an objective of this invention to provide a selective etching process for the removal of a conductive noble metal plating base material from the regions between patterned electrodeposits of a noble metal material which differs from the noble metal plating base material.

It is another objective of the invention to improve the properties of layered structures comprised of a plurality of layers of two or more different conducting materials.

It is still another objective of the invention to improve the properties of layered electrodeposit-on-plating-base structures intended for microelectronic or micromechanical applications.

Yet another objective of the invention is to provide a method and materials for a through-mask electroplating process which permits the plating base to be removed from the regions between the patterned electrodeposits by a wet chemical etch which is selective and anisotropic.

Still another objective is to provide a multilayer metal structure having improved oxidation resistance.

SUMMARY OF THE INVENTION

These and other objectives of the invention are realized by the present invention whereby multilayer metal materials are selected so that the materials will alloy or intermix under annealing conditions. The alloying or intermixing may be accomplished before or after patterning of the materials for the case where the materials are deposited as blanket layers. Likewise, the annealing or intermixing may be accomplished before or after plating base removal for structures deposited by through-mask plating. The individual materials of the multilayers are preferably chosen so that at least one of the materials may be selectively etched with respect to the other materials by wet chemical or electrochemical etch. For electroplating applications, the alloyed plating base material will assume some of the etch resistance of the original electrodeposit material such that a selective wet etch of the plating base can be performed without substantial undercutting.

BRIEF DESCRIPTION OF THE DRAWINGS

The invention will now be described in further detail with reference to the Figures in which.

DETAILED DESCRIPTION OF THE PREFERRED EMBODIMENT

Figure 1A:
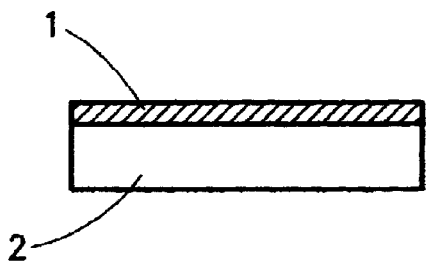
FIGS. 1($a$) through 1($e$) provide schematic illustrations of the through-mask plating process.
Figure 1B:
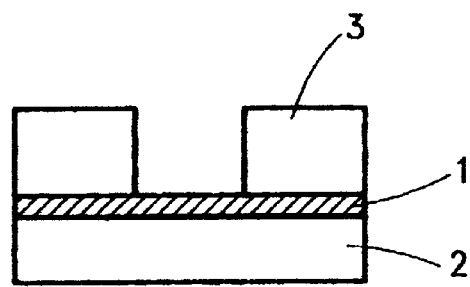
Figure 1C:
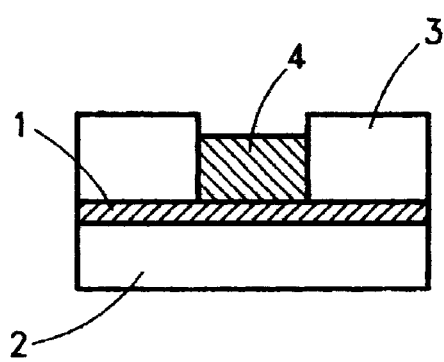
Figure 1D:
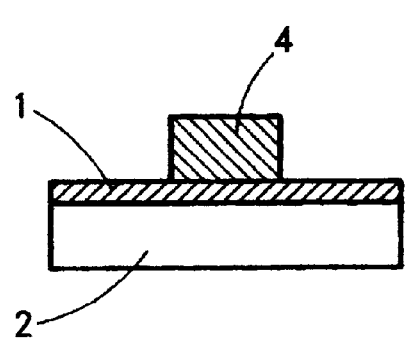
Figure 1E:
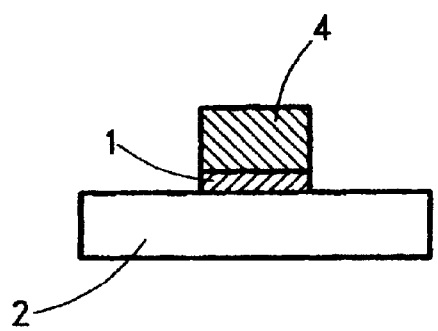
Figure 2A:
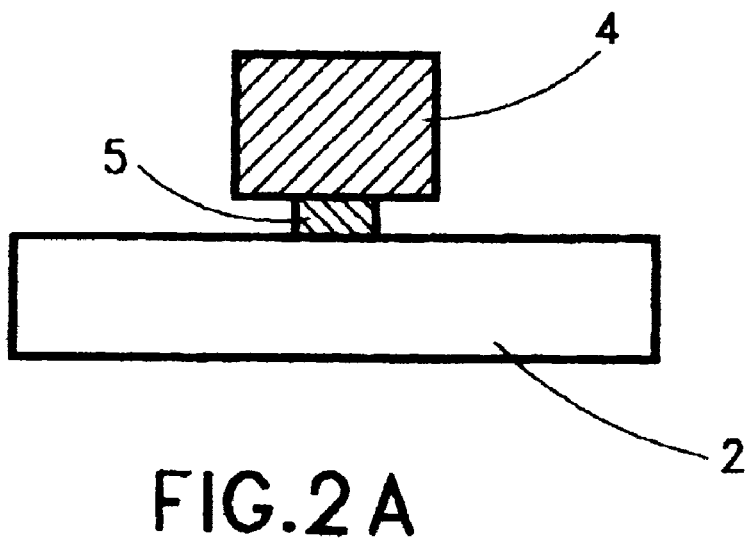
FIGS. 2($a$) and 2($b$) schematically illustrate two structures exhibiting deleterious effects of plating base removal processes.
Figure 2B:
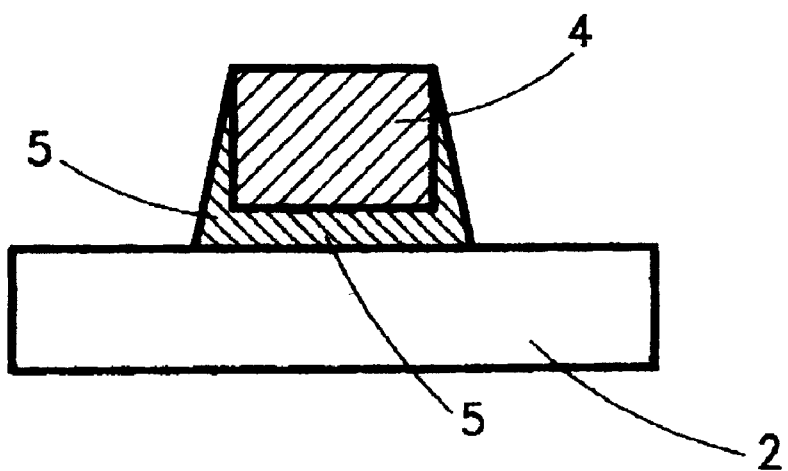
Figure 3A:
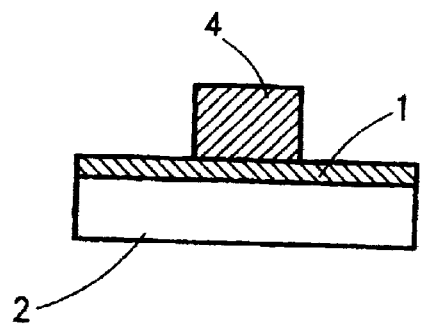
FIGS. 3($a$) through 3($c$) schematically illustrate the process flow for one embodiment of the present invention.
Figure 3B:
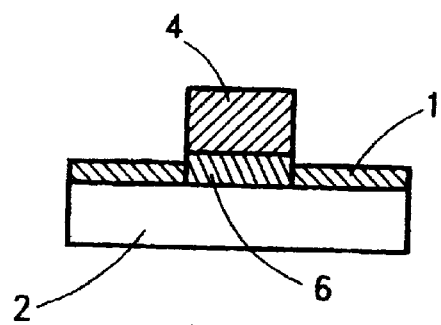
Figure 3C:
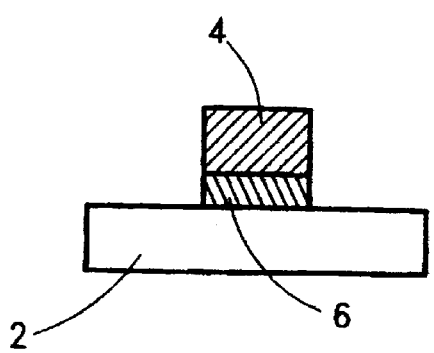

With reference to FIGS. 3($a$) through 3($c$), the present invention will be described for noble metal electroplating which is a potentially desirable process for fabricating electrodes for semiconductor memory cells. FIG. 3($a$) illustrates the structure including a substrate, 2, having a blanket layer of plating base material, 1, onto which has been electrodeposited a feature comprising noble metal, 4, which is different from the metal of the base plating layer. As detailed with reference to the prior art electroplating processes, the noble metal electrodeposit may have been electroplated through a mask, which was subsequently removed. Alternatively, the top metal layer may have been blanket deposited and then patterned to yield the structure of FIG. 3($a$). The inventive step comprises subjecting the blanket plating base layer/electrodeposit structure to a high temperature anneal which causes the plating base material and the electrodeposit to alloy, as shown in the structure of FIG. 3($b$). It should be understood that the terms "to alloy," "alloying," and "alloy formation" used here and elsewhere include the processes of forming metal compounds as well as solid solutions or two-phase mixtures of metal phases. Alloy formation in the plating base layer is localized in the region below the electrodeposit, preferably alloying all of the plating base material and some of the electrodeposit, as indicated by the presence of the alloy, 6, and by the decreased depth of pure metal in the electrodeposit, 4.

Next, the unalloyed plating base in the regions between features is removed with a selective etch to form the structure of FIG. 3($c$). While the FIG. 3($c$) structure is illustrated with all of the underlying alloyed plating base, 6, intact, it is conceivable that some undercutting may still be encountered depending upon the materials chosen, the degree of alloying and the etch process used; however, the degree of undercutting in the inventive structure will be significantly reduced from that seen in earlier structures, if not totally eliminated.

The anneal step should be long enough to obtain good mixing, yet short enough to avoid excessive plating base enrichment at the edges of the electrodeposit and to avoid excessive lateral diffusion of the electrodeposit into the plating base region between features. It should be noted that even a partial plating base/electrodeposit annealing will reap a substantial benefit, since even a moderate decrease in the etch rate of the plating base material located underneath the electrodeposit will greatly reduce undercutting. As will be discussed with reference to FIGS. 4($a$) and 4($b$), there are additional benefits to alloying the plating base with the electrodeposit, even if the anneal is conducted after the plating base material has been removed in the regions between features.

For the illustrated structure, the electrodeposit and the plating base materials are two different conductive materials. For example, the electrodeposit and plating base materials may both be noble metals selected from the group consisting of Ir, Pt, Pd, Rh, Re, Ru, Os, Ag, Au, or alloys thereof. In one preferred embodiment, the plating base comprises 30–50 nm of Pd and the electrodeposit comprises 100–500 nm Pt or Ir. An anneal in the range of 600–750° C. for a period of 1–15 minutes provides sufficient intermixing of the materials to increase the etch resistance of the plating base Pd. A suitable selective etch for the Pd plating base/Pt electrodeposit structure would be a 10:1 mixture of $H_2O_2$:$H_2SO_4$ at a temperature of 65° C. This etch readily removes Pd but does not attack Pt. Similar selectivity would be expected for Pd relative to most of the other noble metals. If plating base enrichment of the electrodeposit is of particular concern, outweighing the disadvantages of plating base undercutting, the alloy anneal may be deferred until after plating base removal. While the anneal cannot then change the undercut profile of the electrode feature, the resulting alloying will serve to protect such structures from oxidation during exposure to the oxidizing environment of subsequent processing. Pd—Pt alloys will be much more resistant to thermal oxidation than would pure Pd, which tends to form highly resistive palladium oxide, thereby degrading the electrical characteristics of the electrode structures.

The plating base and electrodeposit materials for the disclosed process of plating base removal by self-aligned alloying and selective etching may be noble metals or non-noble metals. All that is required is that the plating base be selectively etchable with respect to the electrodeposit and that some intermixing of plating base and electrodeposit occur during annealing. Typically, these conditions can be satisfied with a plating base material selected to be "less noble" than the overlying electrodeposit. Plating base and electrodeposit materials can be selected from the group of metals consisting of: noble metals such as Pt, Pb, Ir, Re, Rh, Ru, Au, Ag, Os; non-noble metals such as Cu, Ni, Mo, Ta, In, Sn, Nb, Fe, W, Ti, etc.; and, alloys or combinations of those metals. As an example, a structure may be fabricated using Cu as the electrodeposit material and Sn as the plating base. These two materials readily alloy and form an alloy which can withstand selective etching of the Sn. An enhanced material results from the addition of the Sn to the Cu, since the alloying greatly improves the electromigration resistance of Cu structures which are used for thin film wiring. This invention thus allows patterned alloy structures to be formed by plating, without the need for directly depositing an alloy.

Figure 4A:
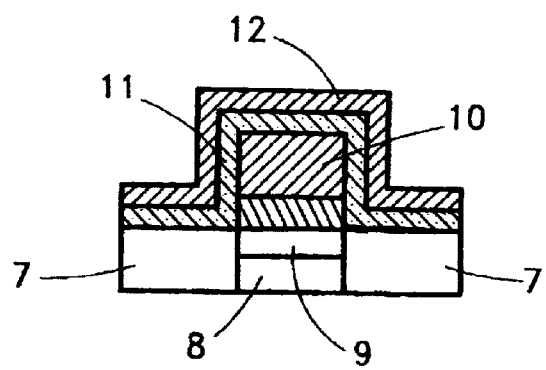
FIGS. 4($a$) through 4($c$) provide schematic cross-sectional views of two capacitors having at least one electrode formed in accordance with the present invention.
Figure 4B:
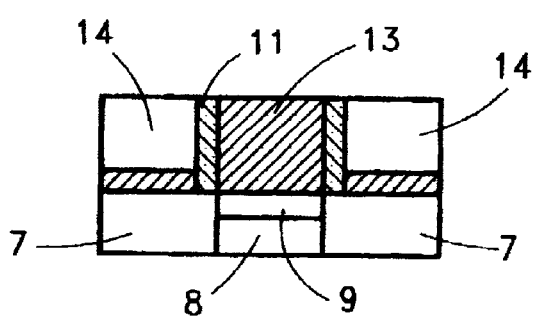
Figure 4C:
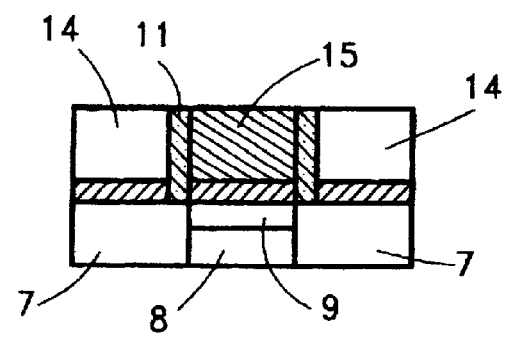

For the above example of the Cu-based wiring structure, such structures might form one or more wiring or via levels in back-end-of-the-line (BEOL) interconnects or packaging. Through-mask plating with plating base removal by selective etching before or after an alloying anneal may be applied to produce a variety of structures. In the alternative, the plating need not be through-mask, as discussed further below with reference to FIGS. 5(a) through 5(h). The disclosed process might be used to form the electrode structures for one or more capacitors or memory elements in a semiconductor device or package incorporating high-epsilon dielectric or ferroelectric materials. Cross-sectional schematic views of exemplary capacitor structures are provided in FIGS. 4(a) through 4(c). The capacitors shown are approximately cylindrical, and built on a dielectric layer, 7, containing an embedded conductive plug, 8, connected to conductive contact regions of device elements in the substrate (not shown). An optional conductive diffusion barrier, 9, can be positioned above the conductive plug. In FIG. 4(a), the bottom electrode, 10, is formed by the disclosed process for providing an electrode structure which is at least partially alloyed. When a high epsilon or ferroelectric material, 11, is disposed between the bottom electrode, 10, and the counterelectrode, 12, the bottom electrode material does not undergo oxidation, nor does the capacitor experience the resulting degraded performance attendant to electrode oxidation. FIG. 4(b) illustrates a structure wherein the bottom electrode, 13, is formed by conventional means, but the counterelectrode is formed by the disclosed process. FIG. 4(c) illustrates a capacitor structure in which both top and bottom electrodes are fabricated in accordance with the present invention, which would necessitate the use of a sacrificial fill material to maintain the gap between the electrodes during electrode processing, followed by removal of that fill material, and filling of the gap with the high-epsilon material.

Figure 5A:
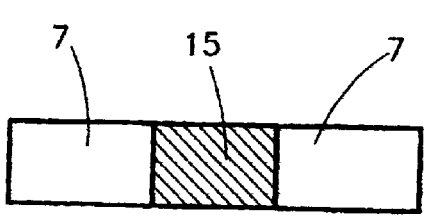
FIGS. 5($a$) through 5($h$) schematically illustrate the process flow for a Damascene version of the present invention.
Figure 5B:
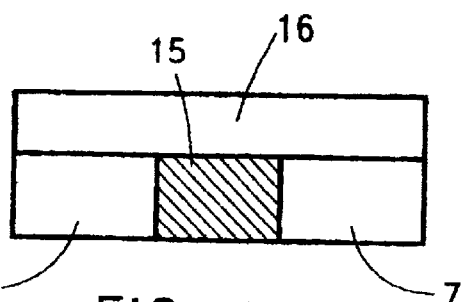
Figure 5C:
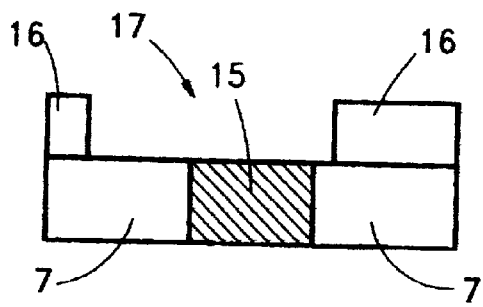
Figure 5D:
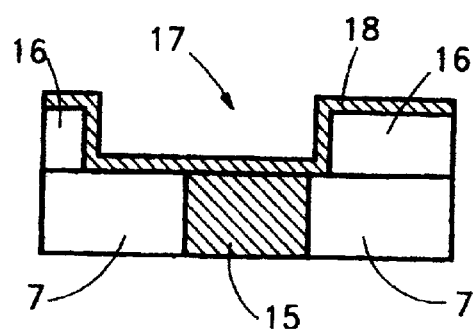
Figure 5E:
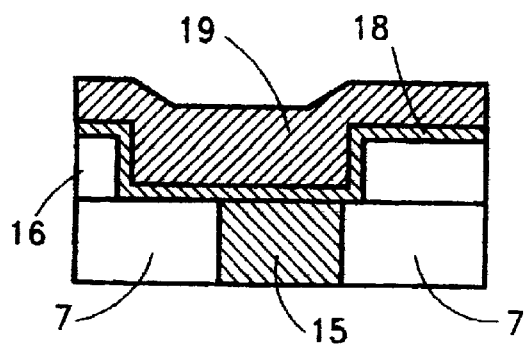
Figure 5F:
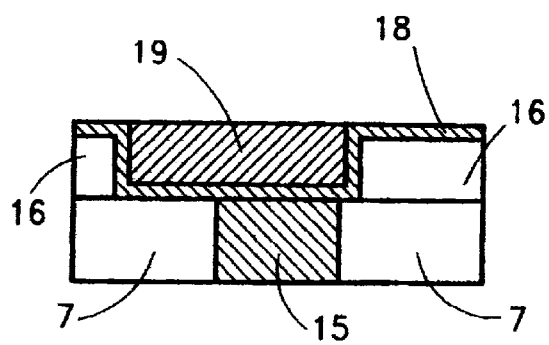
Figure 5G:
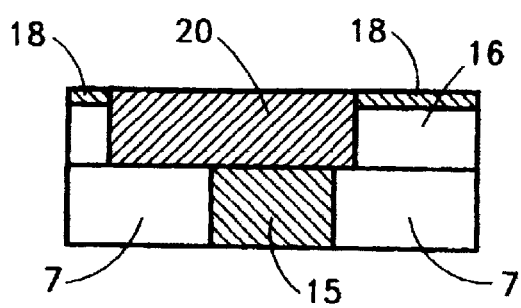
Figure 5H:
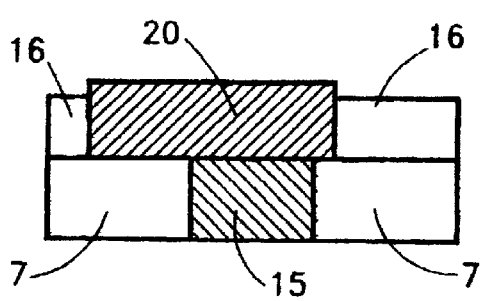

With reference to FIGS. 5(a) through 5(h), the invention may be implemented using a Damascene processing flow. FIG. 5(a) shows a substrate comprising a conductive contact, 15, embedded in dielectric material, 7. A dielectric layer, 16, is deposited, as shown in FIG. 5(b), and patterned to form a cavity, 17, for the wiring metallurgy, as shown in 5(c). The resulting structure is then coated with a conductive plating base layer, 18, to form the structure of FIG. 5(d). Layer 18 might be, for example, a layer of Sn, from 1–50 nm in thickness. If needed, one or more layers (not shown) may be deposited on the structure of FIG. 5(c) prior to plating base deposition in order to improve adhesion or to act as barriers to interlayer reactions. The metal-lined cavity is next filled with a conductive material, 19, as shown in FIG. 5(e). The conductive material may be, for example, cu electroplated onto the plating base layer. The structure of FIG. 5(e) is then planarized by a process such as chemical mechanical polishing (CMP) to form the structure of FIG. 5(f). After annealing to form the alloyed metal structure, shown in FIG. 5(g) to include the alloyed metallurgy 20, the unreacted plating base may be removed by a process such as selective wet etching, yielding the structure of FIG. 5(h). Alloyed metallurgy 20 may alternatively be formed by first removing the exposed plating base from the structure of FIG. 5(f) by a process such as CMP or wet etching, followed by the annealing step.

Compositionally inhomogeneous alloy electrodes for one or more capacitors or memory elements in a semiconductor device or package may also be formed by depositing one or more layers of two or more conductive materials, by a process such as physical vapor deposition (PVD), chemical vapor deposition (CVD), or electrolytic or electroless plating. After deposition, the process flow includes partial or total intermixing or alloying of the layers by a heating process such as rapid thermal annealing, where the intermixing or alloying can be performed before, during or after electrode patterning. The intermixing or annealing step incorporated into a method for producing alloyed electrodes may also be applied to the formation of structural elements other than electrodes for semiconductor memory devices, for example to fabricate micromechanical devices. Furthermore, the inventive process is not limited to materials deposited by plating. For example, a blanket bilayer of Pt over Pd might be deposited, patterned, and then annealed. The individual layers may be pure metals, or metals alloyed with metals or non-metals, forming alloys which comprise two or more of the following materials: Pd, Pt, Ir, Rh, Ru, Re, Au, Ag, Os, Cu, Ni, Sn, Fe, Mo, Ta, In, Ti, Zn, W, Si and Ge. Alloy electrodes produced in this way would be expected to have characteristically inhomogeneous compositions that would differ from those of electrodes initially deposited as alloys. Inhomogeneous or graded-composition materials might be desirable in cases where the surface or top portion of a structural element is preferably enriched in one alloy component (e.g., a noble metal such as Pt which does not easily oxidize) while the bottom portion of the structural element must be enriched in the other alloy component for reasons of, for example, stress relief, adhesion enhancement, or chemical inertness with respect to substrate reactions (e.g., Ti for adhesion, Ir for resistance to silicide formation when deposited on a silicon-containing substrate, etc.). Therefore, incorporation of the annealing step of the present invention to provide in-situ formation of an alloy provides a structure having a superior geometric profile after plating base removal, a structure having favorable physical and chemical properties for withstanding subsequent processing, and a structure comprised of a graded material formed by relatively simple processing over prior art bi-layer or alloy deposits.

Having thus described our invention, what we claim as new and desire to secure by Letters Patent is:

1. A patterned conductive structure formed on a substrate, said structure comprising:
    a first portion formed on said substrate, said first portion comprising at least one alloy of a first conducting material; and
    a second portion positioned over and in contact with said first portion, said second portion comprising second conducting material, wherein said at least one alloy comprises an in-situ formed alloy of said first and said second conducting materials.

2. The structure of claim 1 wherein said first conducting material is selected from the group consisting of Pt, Pd, Ir, Rh, Re, Ru, Os, Au, Ag, Cu, Ni, Sn, Fe, Mo, Ta, In, Ti, Zn, W, or alloys of those metals.

3. The structure of claim 1 wherein said second conducting material is selected from the group consisting of Pt, Pd, Ir, Rh, Re, Ru, Os, Au, Ag, Cu, Ni, Sn, Fe, Mo, Ta, In, Ti, Zn, W, and alloys of those metals.

4. The structure of claim 1 wherein said second conducting material is Cu and wherein said first conducting material is selected from the group consisting of Ni, Fe, Zn, Sn, Mo, Ta, In, Ti, W, alloys of those metals and Cu alloys.

5. The structure of claim 1 wherein said alloy comprises two or more of materials selected from the group consisting of Pd, Pt, Ir, Rh, Ru, Re, Au, Ag, Os, Cu, Ni, Sn, Fe, Mo, Ta, In, Ti, Zn, W, Si and Ge.

6. A capacitor structure formed on a substrate having a conductive contact region, said capacitor structure comprising:
   a first electrode comprising a first portion formed on said substrate over and in contact with said contact region, said first portion comprising at least one alloy of a first conducting material; and a second portion positioned over and in contact with said first portion, said second portion comprising second conducting material, wherein said at least one alloy comprises an in-situ formed alloy of said first and said second conducting materials;
   a layer of insulating material formed adjacent to and in contact with said first electrode; and
   a second electrode formed adjacent to and in contact with said layer of insulating material, wherein said layer of insulating material electrically insulates said first electrode from said second electrode.

7. The structure of claim 6 wherein said insulating material is selected from the group consisting of perovskites, ferroelectrics and high permittivity materials having dielectric constants >10.

8. The structure of claim 6 wherein said contact region comprises a first conductive portion disposed within said substrate and a second conductive portion disposed over said first conductive portion and in contact with said first electrode, said second conductive portion comprising a conductive diffusion barrier to prevent diffusion of said third and said fourth conducting materials into said first conductive portion.

9. The structure of claim 6 wherein said second conducting material is Cu and wherein said first conducting material is selected from the group consisting of Ni, Fe, Zn, Sn, Mo, Ta, Tn, Ti, W, alloys of those metals and Cu alloys.

10. A capacitor structure formed on a substrate having a conductive contact region comprising:
    a first electrode formed on said substrate over and in contact with said contact region;
    a layer of insulating material formed adjacent to and in contact with said first electrode; and
    a second electrode formed adjacent to and in contact with said layer of insulating material, said second electrode comprising a first portion formed on said substrate, said first portion comprising at least one alloy of a first conducting material; and a second portion positioned over an in contact with said first portion, said second portion comprising second conducting material, wherein said at least one alloy comprises an in-situ formed alloy of said first and said second conducting materials, wherein said layer of insulating material electrically insulates said first electrode from said second electrode.

11. The structure of claim 10 wherein said insulating material is selected from the group consisting of perovskites, ferroelectrics and high permittivity materials having dielectric constants >10.

12. The structure of claim 10 wherein said contact region comprises a first conductive portion disposed within said substrate and a second conductive portion disposed over said first conductive portion and in contact with said first electrode, said second conductive portion comprising a conductive diffusion barrier to prevent diffusion of said third and said fourth conducting materials into said first conductive portion.

13. The structure of claim 10 wherein said second conducting material is Cu and wherein said first conducting material is selected from the group consisting of Ni, Fe, Zn, Sn, Mo, Ta, Tn, Ti, W, alloys of those metals and Cu alloys.

14. A capacitor structure formed on a substrate having a conductive contact region comprising:
    a first electrode formed on said substrate over and in contact with said contact region, said first electrode comprising a first portion formed on said substrate, said first portion comprising at least one alloy of a first conducting material; and a second portion positioned over and in contact with said first portion, said second portion comprising second conducting material, wherein said at least one alloy comprises an in-situ formed alloy of said first and said second conducting materials;
    a layer of insulating material formed adjacent to and in contact with said first electrode; and
    a second electrode formed adjacent to and in contact with said layer of insulating material, said second electrode comprising a third portion formed on said substrate, said third portion comprising at least one alloy of a third conducting material; and a fourth portion positioned over and in contact with said third portion, said fourth portion comprising fourth conducting material, wherein said at least one alloy comprises an in-situ formed alloy of said third and said fourth conducting materials, wherein said layer of insulating material electrically insulates said first electrode from said second electrode.

15. The structure of claim 14 wherein said insulating material is selected from the group consisting of perovskites, ferroelectrics and high permittivity materials having dielectric constants >10.

16. The structure of claim 14 wherein said contact region comprises a first conductive portion disposed within said substrate and a second conductive portion disposed over said first conductive portion and in contact with said first electrode, said second conductive portion comprising a conductive diffusion barrier to prevent diffusion of said third and said fourth conducting materials into said first conductive portion.

17. The structure of claim 14 wherein said second conducting material is Cu and wherein said first conducting material is selected from the group consisting of Ni, Fe, Zn, Sn, Mo, Ta, Tn, Ti, W, alloys of those metals and Cu alloys.

* * * * *